(12) United States Patent
Park et al.

(10) Patent No.: US 8,266,796 B2
(45) Date of Patent: Sep. 18, 2012

(54) METHOD OF FABRICATING A SEMICONDUCTOR DEVICE PACKAGE

(75) Inventors: Ji-Yong Park, Yongin-si (KR); Kyoung-Sei Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1080 days.

(21) Appl. No.: 12/153,560

(22) Filed: May 21, 2008

(65) Prior Publication Data
US 2008/0291655 A1 Nov. 27, 2008

(30) Foreign Application Priority Data

May 23, 2007 (KR) .................. 10-2007-0050463

(51) Int. Cl.
 *H01K 3/10* (2006.01)
(52) U.S. Cl. ............... 29/850; 29/830; 29/831; 29/832; 29/852; 29/854
(58) Field of Classification Search ............ 29/850, 29/830, 831, 832, 852, 854, 857, 874, 860; 361/820; 438/121, 106, 108, 118, 119, 127; 257/268, 778, 777, E21.002, E23.01
See application file for complete search history.

(56) References Cited

U.S. PATENT DOCUMENTS

| | | | | |
|---|---|---|---|---|
| 5,616,520 A | * | 4/1997 | Nishiuma et al. | 438/125 |
| 6,329,610 B1 | * | 12/2001 | Takubo et al. | 174/264 |
| 6,664,130 B2 | * | 12/2003 | Akram | 438/108 |
| 6,864,130 B2 | * | 3/2005 | Koo et al. | 438/166 |
| 6,911,729 B1 | * | 6/2005 | Chikawa | 257/724 |
| 6,952,048 B2 | * | 10/2005 | Terui | 257/678 |
| 7,012,339 B2 | * | 3/2006 | Terui | 257/786 |
| 2004/0159933 A1 | * | 8/2004 | Sunohara et al. | 257/700 |
| 2006/0097368 A1 | | 5/2006 | Seko | |

FOREIGN PATENT DOCUMENTS

| | | |
|---|---|---|
| JP | 05-037113 | 2/1993 |
| JP | 2001-85457 | 3/2001 |
| JP | 2003-188263 | 7/2003 |

(Continued)

OTHER PUBLICATIONS

English Language Abstract of KR 1020060052592 published May 19, 2006.

*Primary Examiner* — Derris Banks
*Assistant Examiner* — Tai Nguyen
(74) *Attorney, Agent, or Firm* — Harness, Dickey & Pierce, P.L.C.

(57) ABSTRACT

Provided is a wiring substrate, a semiconductor device package including the wiring substrate, and methods of fabricating the same. The semiconductor device package may include a wiring substrate which may include a base film. The base film may include a mounting region and a non-mounting region. The wiring substrate may further include first wiring patterns on the non-mounting region and extending into the mounting region, second wiring patterns on the first wiring patterns of the non-mounting region, and an insulating layer on the non-mounting region, and a semiconductor device which may include bonding pads. At least one of side surfaces of the second wiring patterns adjacent to the mounting region may be electrically connected to at least one of the bonding pads of the semiconductor device.

26 Claims, 11 Drawing Sheets

FOREIGN PATENT DOCUMENTS

| | | |
|---|---|---|
| JP | 2003-324129 A | 11/2003 |
| JP | 2004-207303 | 7/2004 |
| JP | 2005-109377 A | 4/2005 |
| JP | 2006-165517 * | 6/2006 |
| KR | 2001-0073946 | 8/2001 |
| KR | 1020060045563 A | 5/2006 |
| KR | 100658442 B1 | 12/2006 |
| KR | 10-2007-0007254 | 1/2007 |
| KR | 10-0667642 | 1/2007 |

* cited by examiner

METHOD OF FABRICATING A SEMICONDUCTOR DEVICE PACKAGE

PRIORITY STATEMENT

This application claims priority under 35 U.S.C. §119 to Korean Patent Application No. 10-2007-0050463, filed on May 23, 2007, in the Korean Intellectual Property Office (KIPO), the entire contents of which are hereby incorporated by reference.

BACKGROUND

Example embodiments relate to a wiring substrate, a semiconductor device package including the wiring substrate and methods of fabricating the same. More particularly, example embodiments relate to a semiconductor device package including a film type wiring substrate and a method of fabricating the same.

Many electronic devices, e.g., mobile phones, personal digital assistants (PDAs), liquid crystal display (LCD) panels, and notebook computers, are designed to be relatively small, slim, and lightweight. Accordingly, components, e.g., semiconductor devices, mounted in those electronic devices, must be relatively small, slim, and lightweight. In addition, these components must be highly functional and able to achieve increased performance and increased-density.

Tape substrates are increasingly being used in order to meet the demands for a highly integrated high-speed/high-density semiconductor device. The tape substrate may have a structure in which a wiring pattern and an inner lead connected thereto are on a thin film formed of an insulating material, e.g., a polyimide resin. Tape automated bonding (TAB) technology may be used for bonding the inner lead of the tape substrate to bumps on a semiconductor device.

Examples of a semiconductor device package using the tape substrate may include a tape carrier package (TCP) and a chip on film (COF) package. The TCP has a structure wherein a semiconductor device may be mounted on an inner lead exposed to a window of a tape substrate by an inner lead bonding (ILB) method. The COF package has a structure wherein a semiconductor device may be mounted on a tape substrate by a flip chip bonding (F/C bonding) method.

FIG. 1 is a cross-sectional view illustrating a conventional semiconductor device package having a COF semiconductor device package. As shown, the semiconductor device is mounted on a wiring substrate. Referring to FIG. 1, a semiconductor device package may include a wiring substrate, a semiconductor device 10, and an insulating resin 30.

The wiring substrate may include a base film 20, a wiring pattern 24, a bonding assisting layer 25, and an insulating layer 26. The base film 20 may have a mounting region (not shown) in which the semiconductor device 10 is mounted. The wiring pattern 24 may include an exposed surface in the mounting region of the wiring substrate, and thus may serve as an inner lead. The wiring pattern 24 may also include a surface covered with the insulating layer 26 in a non-mounting region of the wiring substrate and thus may serve as an outer lead. For example, the wiring pattern 24 may include an inner lead and an outer lead. The bonding assisting layer 25 may be disposed on the wiring pattern 24. The bonding assisting layer 25 may serve as a medium to provide an electrical connection between the wiring substrate and bumps 14 disposed on bonding pads 12 of the semiconductor device 10. Also, the bonding assisting layer 25 may serve to prevent or reduce oxidation of the wiring pattern 24 from an external environment. The insulating layer 26 may be on the non-mounting region of the wiring substrate and may protect the wiring substrate, including the wiring pattern 24, from the external environment.

The semiconductor device 10 may include an active surface which may include the bonding pads 12. The semiconductor device 10 may be mounted such that its active surface contacts the mounting region of the wiring substrate The insulating resin 30 may be disposed between the wiring substrate and the semiconductor device 10 and on side surfaces of the semiconductor device 10. The insulating resin 30 may protect the wiring pattern 24 in the mounting region, which corresponds to the inner lead, from the external environment while protecting the semiconductor device 10 of the semiconductor device package from the external environment.

SUMMARY

Example embodiments provide a method of fabricating a wiring substrate for mounting a semiconductor device that may include bonding pads on an active surface and/or a side surfaces thereof.

Example embodiments also provide a semiconductor device package that may include a semiconductor device with bonding pads on an active surface and/or a side surface thereof, and a wiring substrate on which the semiconductor device may be mounted, and a method of fabricating the same.

According to example embodiments, a method of fabricating a wiring substrate may include preparing a base film including a first region and a second region, forming a first wiring pattern on the second region and extending into the first region, and forming a second wiring pattern on the first wiring pattern on the second region, wherein a side surface of the second wiring pattern adjacent to the first region is configured to electrically connect to a semiconductor device.

According to example embodiments, a method of fabricating a semiconductor device package may include preparing a base film including a first region and a second region, forming a first wiring pattern on the second region and extending into the first region, and forming a second wiring pattern on the first wiring pattern on the second region, wherein a side surface of the second wiring pattern adjacent to the first region is configured to electrically connect to a semiconductor device, preparing a semiconductor device that may include a bonding pad, and mounting the semiconductor device on a first region of the wiring substrate, wherein the bonding pad of the semiconductor device and a side surface of a second wiring pattern adjacent to the first region may be electrically connected.

According to example embodiments, a wiring substrate may include a base film including a first region and a second region, a first wiring pattern on the second region and extending into the first region, and a second wiring pattern on the first wiring pattern on the second region, wherein a side surface of the second wiring pattern adjacent to the first region may be configured to electrically connect to a semiconductor device.

According to example embodiments, a semiconductor device package may include a wiring substrate which may include a base film wherein the base film may include a first region and a second region, first wiring patterns on the second region and extending into the first region, second wiring patterns on the first wiring patterns on the second region, and a semiconductor device on a first region of the wiring substrate wherein the semiconductor device includes bonding pads and at least one of a side surfaces of the second wiring patterns adjacent to the first region of the wiring substrate may be electrically connected to at least one of the bonding pads of the semiconductor device.

BRIEF DESCRIPTION OF THE DRAWINGS

Example embodiments will be more clearly understood from the following detailed description taken in conjunction with the accompanying drawings. FIGS. 2-4B represent non-limiting, example embodiments as described herein.

FIG. 2 is a cross-sectional view for explaining a semiconductor device package according to example embodiments;

FIGS. 4A and 4B are cross-sectional views for explaining a method of fabricating a semiconductor device package according to example embodiments.

DETAILED DESCRIPTION OF EXAMPLE EMBODIMENTS

Figure 1:
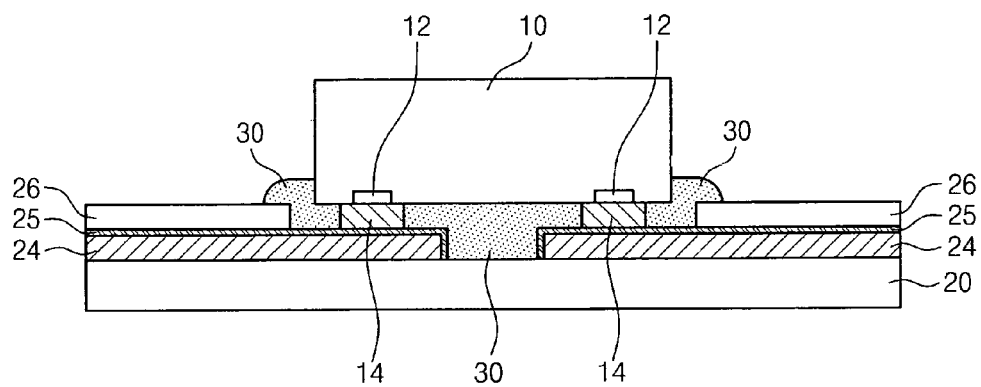
FIG. 1 is a cross-sectional view for explaining a conventional semiconductor device package.

Example embodiments are described more fully hereinafter with reference to the accompanying drawings. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers that may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section. Thus a first element, component, region, layer or section discussed below could be termed a second element, component, region, layer or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes of regions of elements and do not limit example embodiments.

Figure 2:
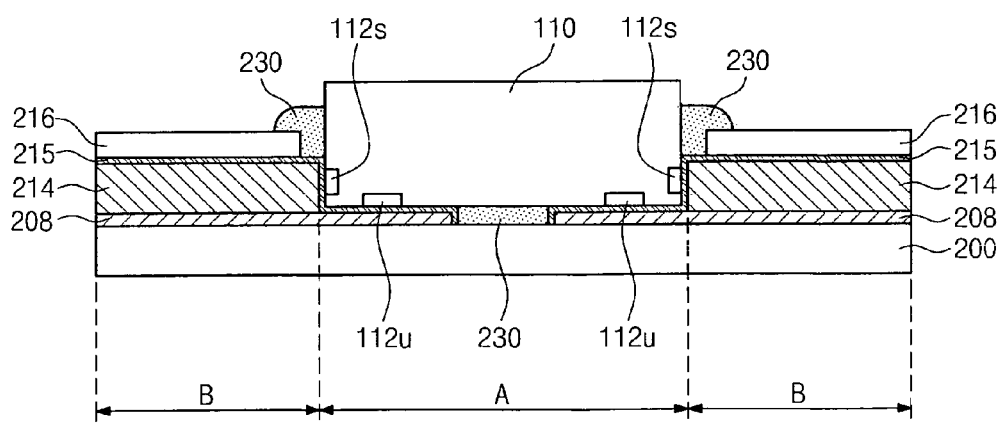

FIG. 2 is a cross-sectional view for explaining a semiconductor device package according to example embodiments. In FIG. 2, a chip on film (COF) semiconductor device package in which a semiconductor device may be mounted on a wiring substrate is illustrated as an example. Referring to FIG. 2, the semiconductor device package may include a wiring substrate, a semiconductor device 110 and an insulating resin 230.

The wiring substrate may include a base film 200, first wiring pattern 208, second wiring pattern 214, a metal layer 215 for bonding (hereinafter, referred to as a bonding metal layer 215), and an insulating layer 216. The base film may include a mounting region A or a first region on which the semiconductor device 110 may be mounted. The base film 200 may include polyimide.

The first wiring pattern 208 may include copper (Cu). Although not shown, the wiring substrate may further include a metal seed layer 202 of FIG. 3A, which may be between the first wiring pattern 208 and the base film 200. The metal seed layer may serve as an electrode in an electroplating process for forming the first wiring pattern 208. The first wiring pattern 208 may include an exposed surface in the mounting region A of the wiring substrate and thus may serve as an inner lead.

The second wiring pattern 214 may be on the first wiring pattern 208 in a non-mounting region B or a second region of the wiring substrate. The second wiring pattern 214 may include copper. The second wiring pattern 214 may be covered with the insulating layer 216 in the non-mounting region B together with the first wiring pattern 208 placed under the second wiring pattern 214 and thus may serve an outer lead. Side surfaces of the second wiring pattern 214 adjacent to the mounting region A of the wiring substrate may be substantially perpendicular to an upper surface of the first wiring pattern 208. The side surfaces of the second wiring pattern 214 adjacent to the mounting region A of the wiring substrate may correspond to the mounting region A of the wiring substrate.

The bonding metal layer 215 may be disposed on the first wiring pattern 208 and the second wiring pattern 214. The bonding metal layer 215 may include a material that may form a metal bonding layer with materials of bonding pads 112s and 112u of the semiconductor device 110. The bonding metal layer 215 may include tin (Sn) or gold (Au). Thus, the bonding metal layer 215 may serve as a medium that provides an electrical connection between the semiconductor device 110 and the wiring substrate. The bonding metal layer 215 on the upper surface of the first wiring pattern 208 and on the side surfaces of the second wiring pattern 214 adjacent to the mounting region A of the wiring substrate may be connected with bonding pads 112s and 112u of the semiconductor device 110. The semiconductor device package according to example embodiments does not require bumps unlike the conventional semiconductor device package illustrated in FIG. 1. Also, the bonding metal layer 215 may serve to prevent or reduce oxidation of the first wiring pattern 208 and the second wiring pattern 214 from an external environment.

The insulating layer 216 may be on a non-mounting region B of the wiring substrate and may include solder resist. The insulating layer 216 may be disposed in the non-mounting region B of the wiring substrate and thus may protect the wiring substrate including the first wiring pattern 208 and the second wiring pattern 214 from the external environment.

The semiconductor device 110 may include an active surface, a rear surface facing the active surface, and side surfaces. The semiconductor device 110 may be mounted such that the active surface contacts the mounting region A of the wiring substrate. Because the side surfaces of the second wiring pattern 214 adjacent to the mounting region A of the wiring substrate may correspond to the mounting region A of the wiring substrate, the side surfaces of the semiconductor device 110 may contact the side surfaces of the second wiring pattern 214.

The semiconductor device 110 may include bonding pads 112u on the active surface (hereinafter, also referred to as active-surface bonding pads 112u). According to example embodiments, bonding pads 112s may be disposed on the side surfaces of the semiconductor device 110 (hereinafter, also referred to as side bonding pads 112s). The semiconductor device 110 that may include the side bonding pads 112s may be the same as that disclosed in Korean Patent Application No. 10-2007-0007254 by Park, Ji-yong, the entire contents of which are hereby incorporated by reference. As in Korean Patent Application No. 10-2007-0007254, the bonding pads 112s and 112u may be disposed on the active surface and/or the side surfaces of the semiconductor device 110. For example, the semiconductor device 110, according to example embodiments, may include the side bonding pads 112s and/or the active-surface bonding pads 112u. The side bonding pads 112s and the active-surface bonding pads 112u may be arranged on the side surfaces and the active surface of the semiconductor device 110 so as to be on different planes.

The insulating resin 230 may be between the wiring substrate and the semiconductor device 110 and on the side surfaces of the semiconductor device 110. The insulating resin 230 may protect the semiconductor device 110 from the external environment and may protect the first wiring pattern 208 in the mounting region A, which corresponds to the inner lead, from the external environment.

In a semiconductor device package, according to example embodiments, a wiring substrate may include a wiring pattern having a stepped surface, and the stepped surface may be electrically connected to side bonding pads of a semiconductor device. Thus, the semiconductor device package may include the semiconductor device with the side bonding pads. The semiconductor device package may provide an electrical connection with bonding pads of the semiconductor device via a bonding metal layer on an upper surface and the stepped surface of the wiring pattern. Therefore, bumps are not necessary. Accordingly, the semiconductor device package according to example embodiments may allow an increase in pitch, width and/or number of the wiring patterns, unlike a conventional semiconductor device package using bumps. Accordingly, a margin of a process for fabricating the semiconductor device package may be ensured. Furthermore, because the stepped surfaces of the wiring patterns may correspond to the mounting region of the wiring substrate, self-alignment may be achieved during a process of mounting the semiconductor device on the wiring substrate.

Figure 3A:
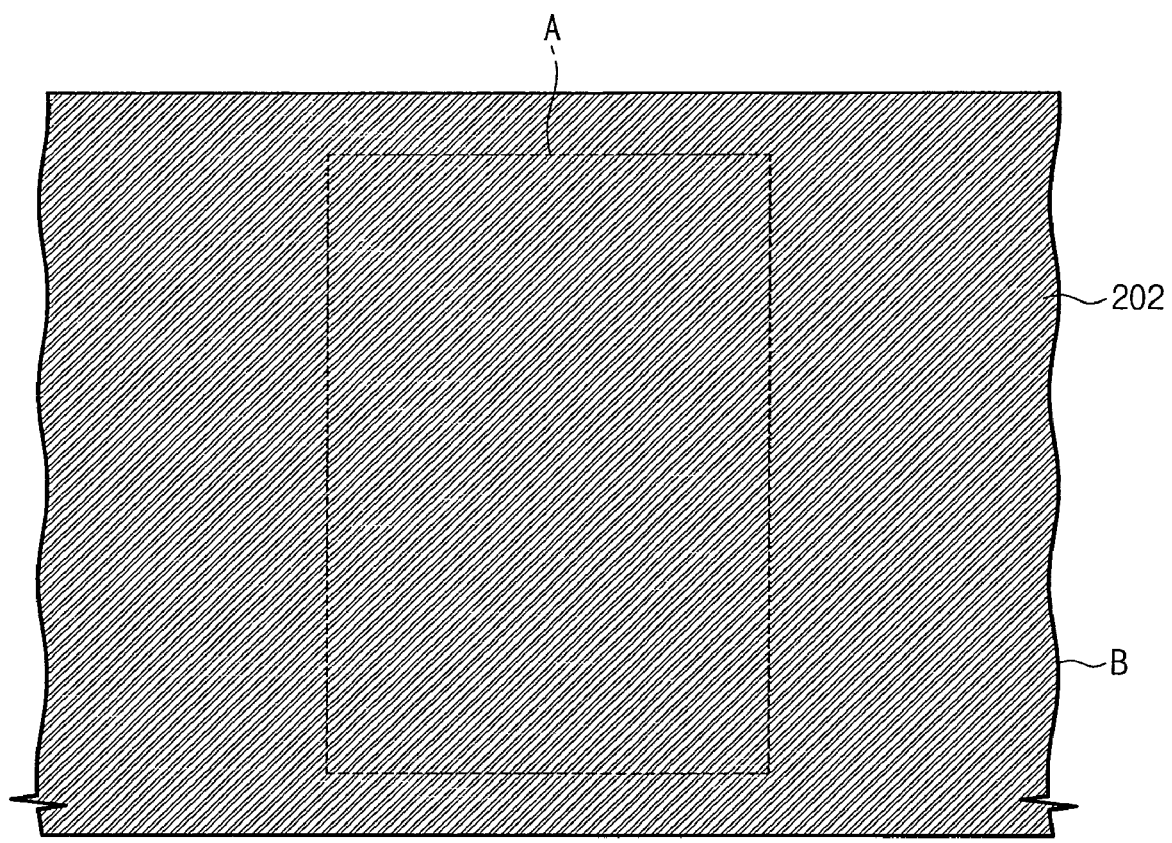
FIGS. 3A through 3I are plan views for explaining a method of fabricating a wiring substrate according to example embodiments.
Figure 3B:
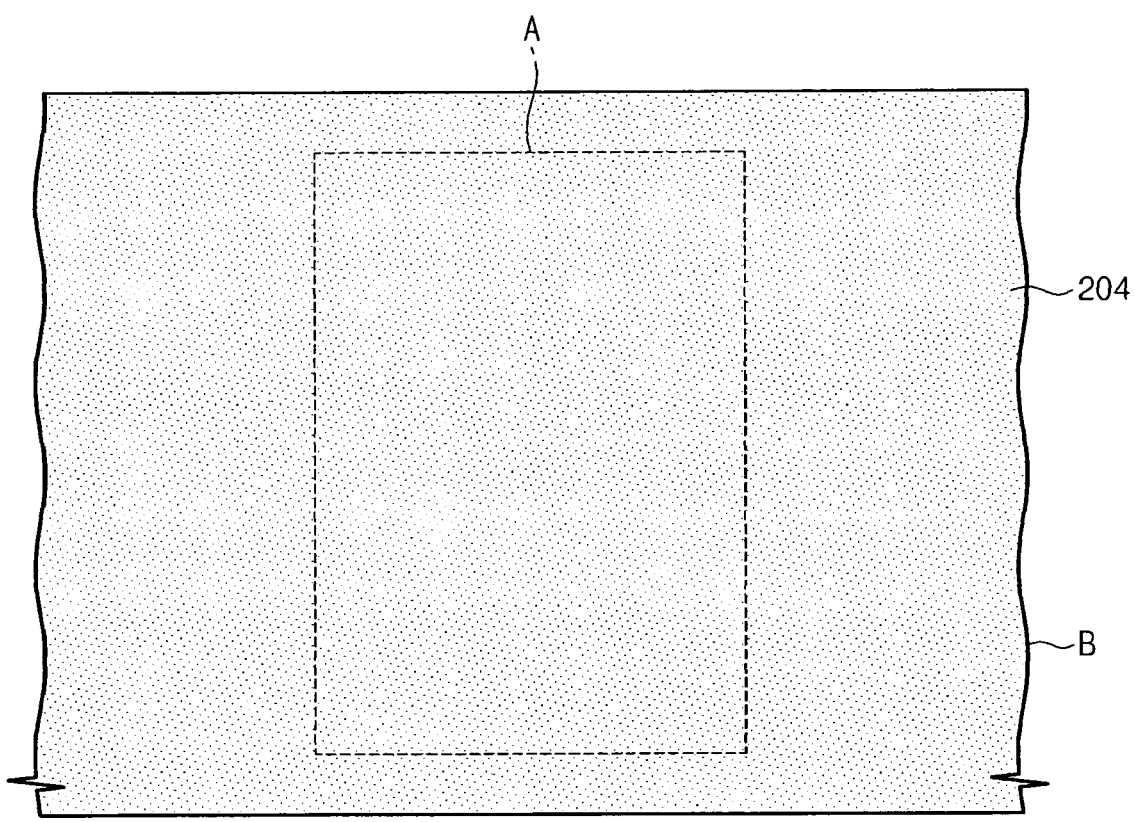

FIGS. 3A through 3I are plan views for explaining a method of fabricating a wiring substrate according to example embodiments. Referring to FIGS. 3A and 3B, a base film 200 of FIG. 3I including a mounting region A may be prepared. The base film may include polyimide. A metal seed layer 202 may be formed on an entire surface of the base film, and thus, may serve as an electrode in an electroplating process, which may be a subsequent process for forming a wiring pattern. A first photoresist layer 204 may be formed on the surface of the metal seed layer 202.

Figure 3C:
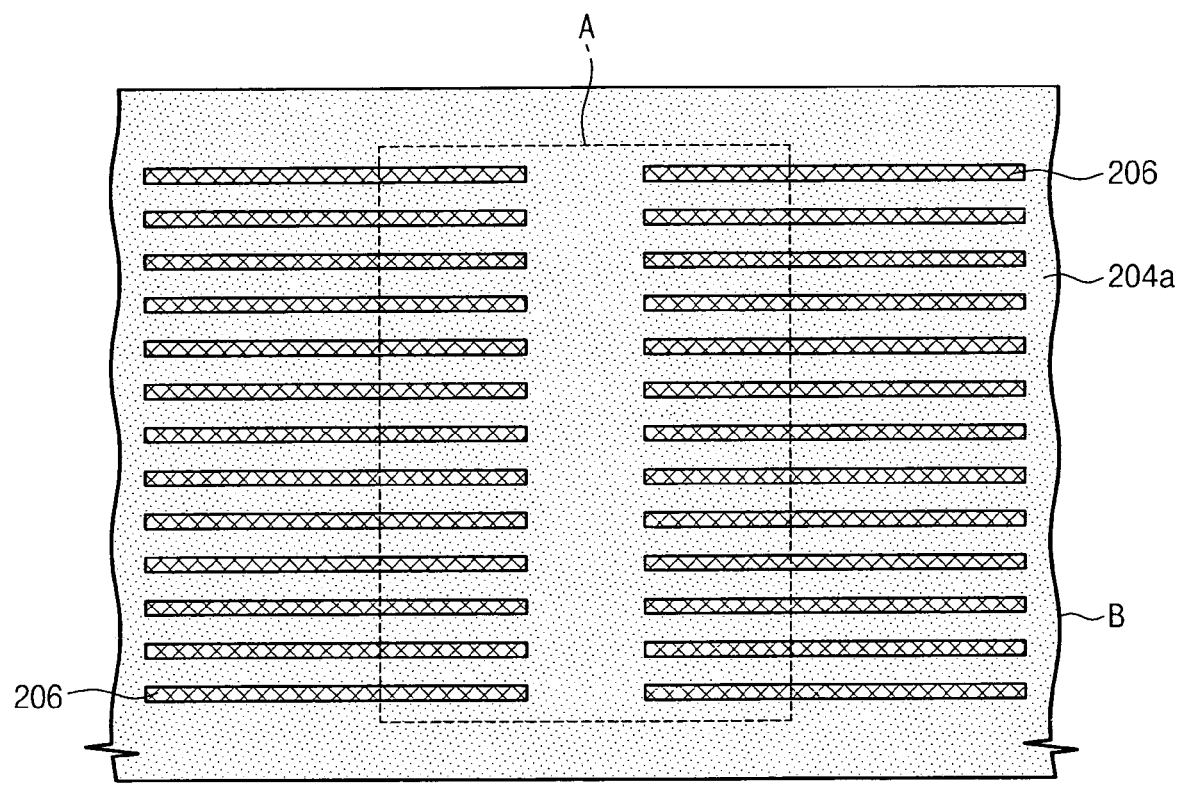
Figure 3D:
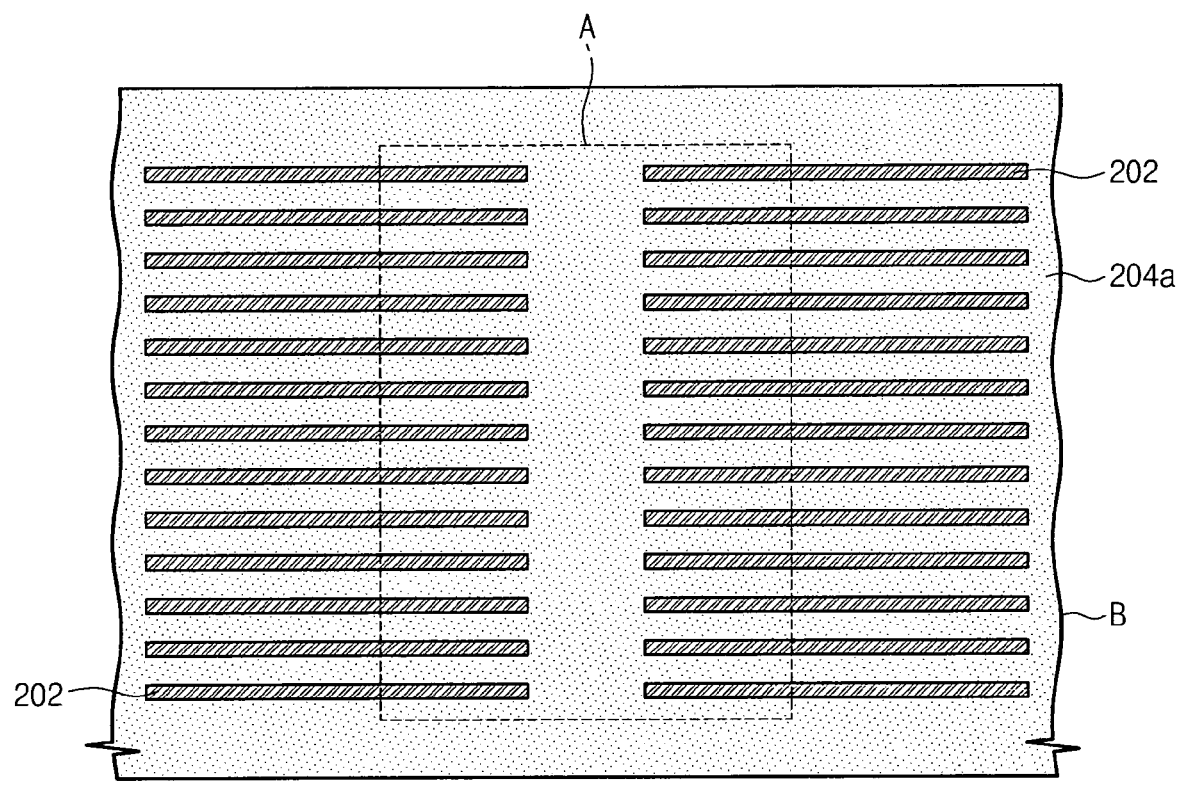

Referring to FIGS. 3C and 3D, a first mask pattern 206 may be formed on the first photoresist layer 204 to define a first wiring pattern region. The first photoresist layer 204 may be exposed by an exposure process using the first mask pattern 206 as a mask, and then, the first mask pattern 206 may be removed. The first photoresist layer 204 may be developed by a development process, thereby forming a first photoresist pattern 204a exposing the metal seed layer 202 of the first wiring pattern region.

Figure 3E:
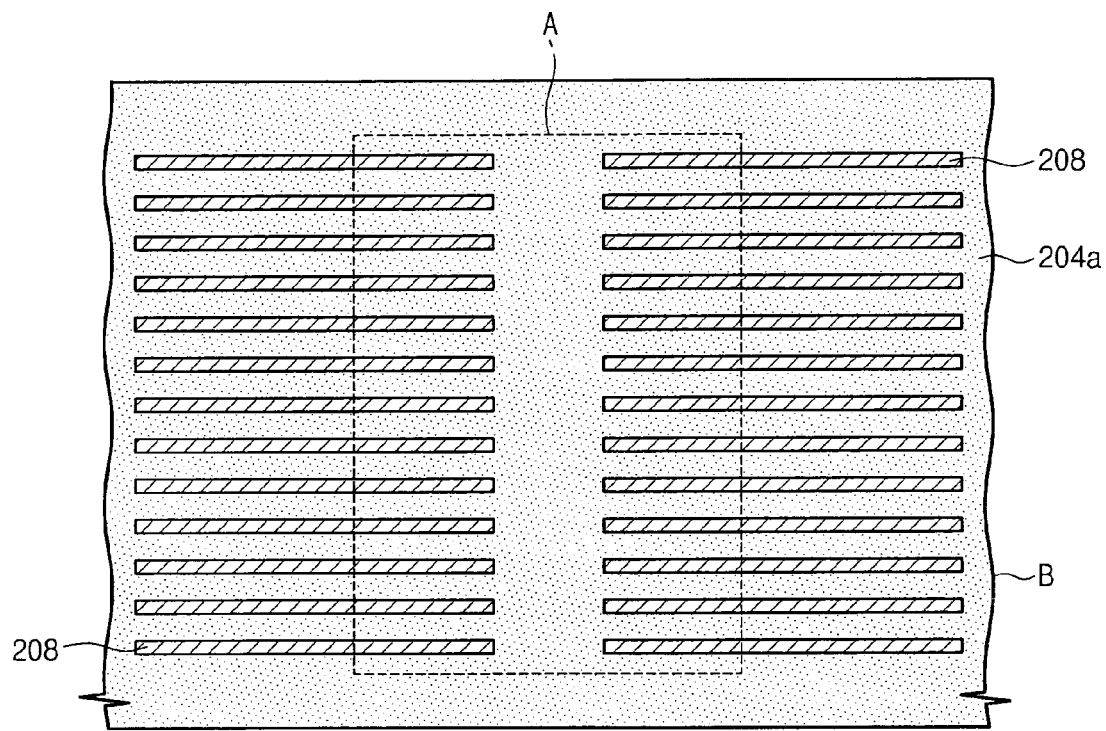
Figure 3F:
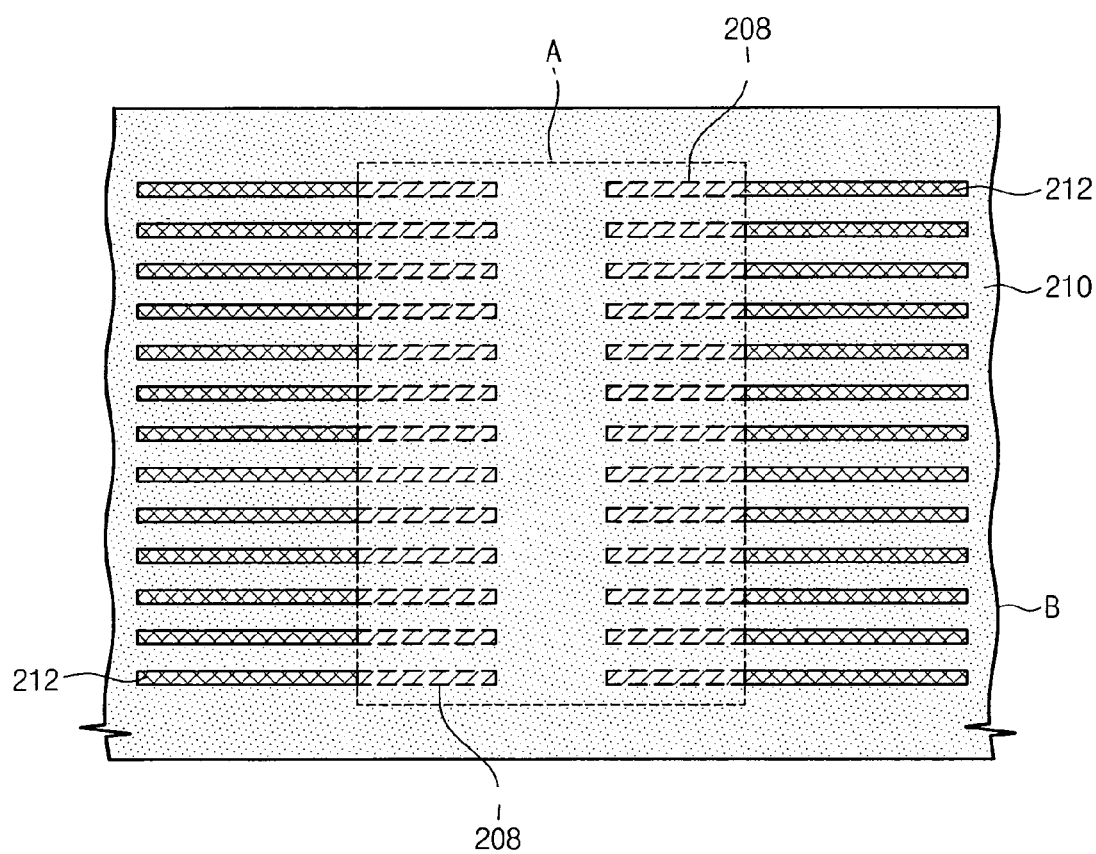

Referring to FIGS. 3E and 3F, a first wiring pattern 208 may be formed in the first wiring pattern region exposed by the first photoresist pattern 204a. The first wiring pattern 208 may include copper (Cu). The first wiring pattern 208 may be formed by an electroplating method. Because the first wiring pattern 208 may be formed by the electro-plating, a thickness of the first wiring pattern 208 may be controlled according to a process condition. A second photoresist layer 210 may be formed on an entire resulting structure including the first wiring pattern 208. A second mask pattern 212 may be formed on the second photoresist layer 210 to define a second wiring pattern region.

Figure 3G:
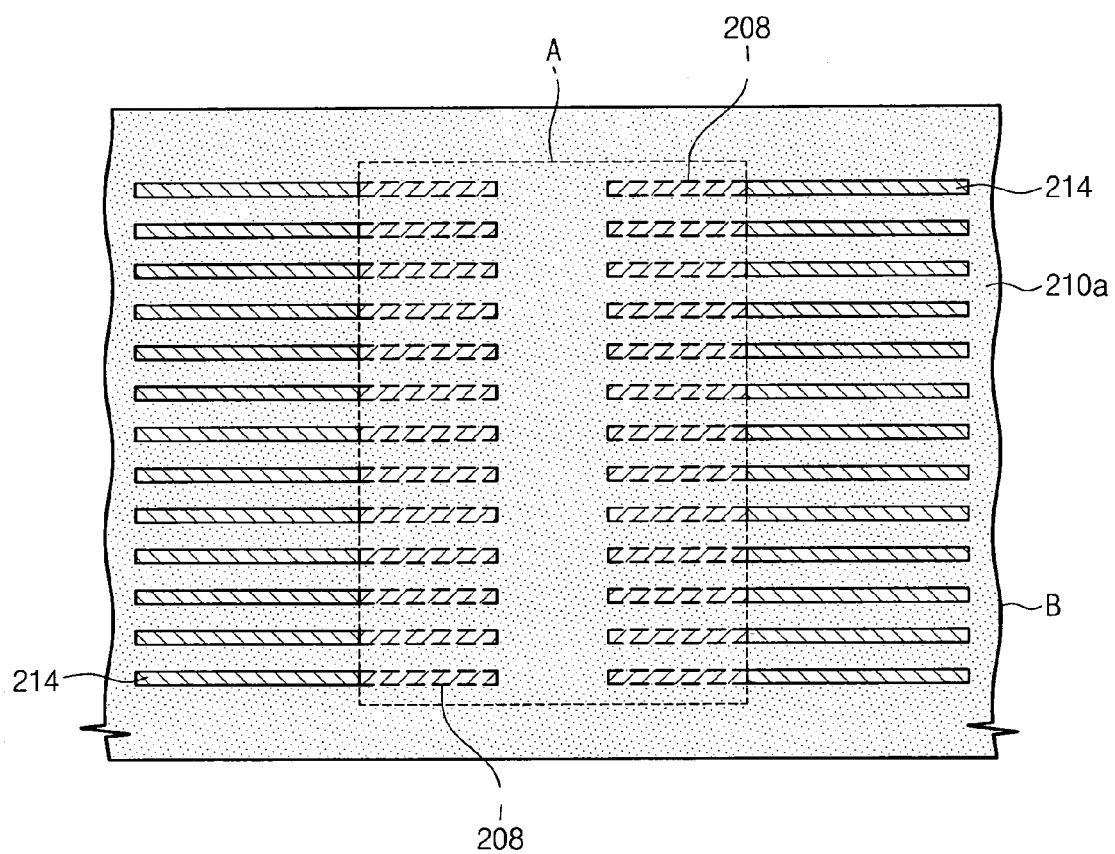
Figure 3H:
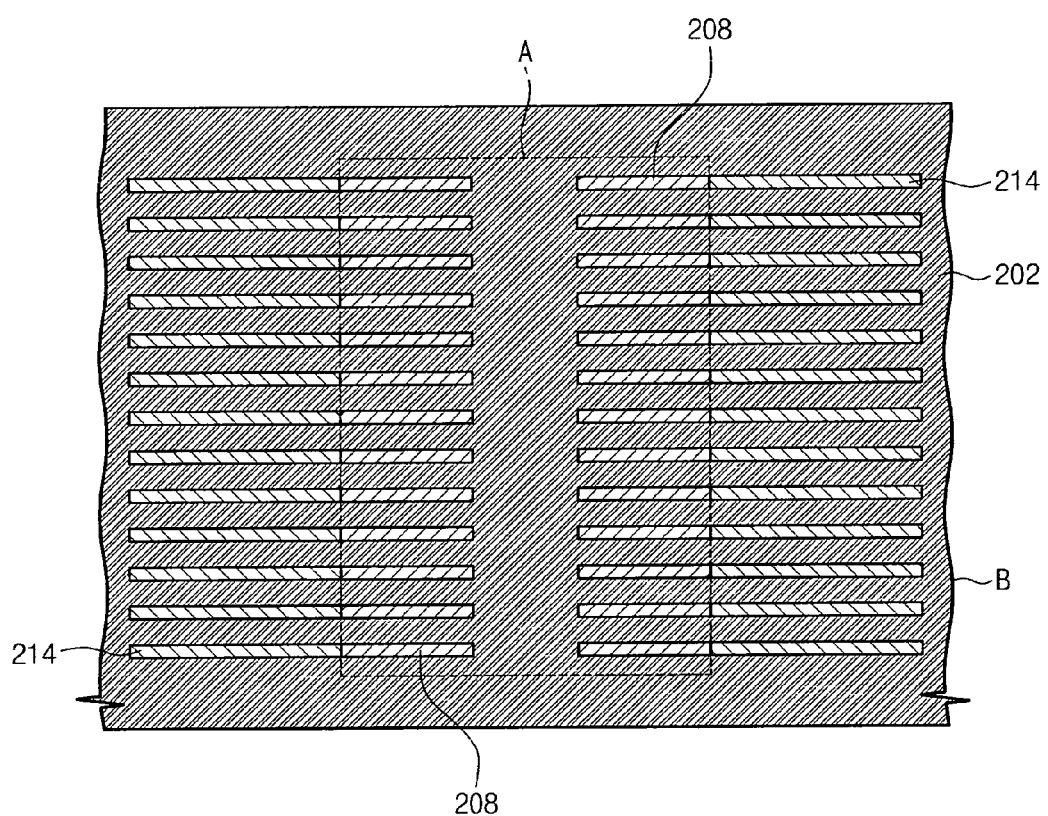

Referring to FIGS. 3G and 3H, the second photoresist layer 210 may be exposed by an exposure process using the second mask pattern 212 as a mask, and then, the second mask pattern 212 may be removed. Thereafter, the second photoresist layer 210 may be developed by a development process, thereby forming a second photoresist pattern 210a exposing the first wiring pattern 208 in the second wiring pattern region. A second wiring pattern 214 may be formed in the second wiring pattern region exposed by the second photoresist pattern 210a. The second wiring pattern 214 may include copper. The second wiring pattern 214 may be formed by an electroplating method. Because the second wiring pattern 214 may be formed by the electroplating method, the thickness of the second wiring pattern 214 may be controlled according to a process condition.

Because the second wiring pattern 214 may be formed by the electroplating method using the second photoresist pattern 210a as a mold frame, side surfaces of the second wiring pattern 214 adjacent to the mounting region A of the wiring substrate may be substantially perpendicular to an upper surface of the first wiring pattern 208. The side surfaces of the second wiring pattern 214 adjacent to the mounting region A of the wiring substrate may correspond to the mounting region A of the wiring substrate. Thereafter, the second photoresist pattern 210a and the first photoresist pattern 204a of FIG. 3E may be removed.

Figure 3I:
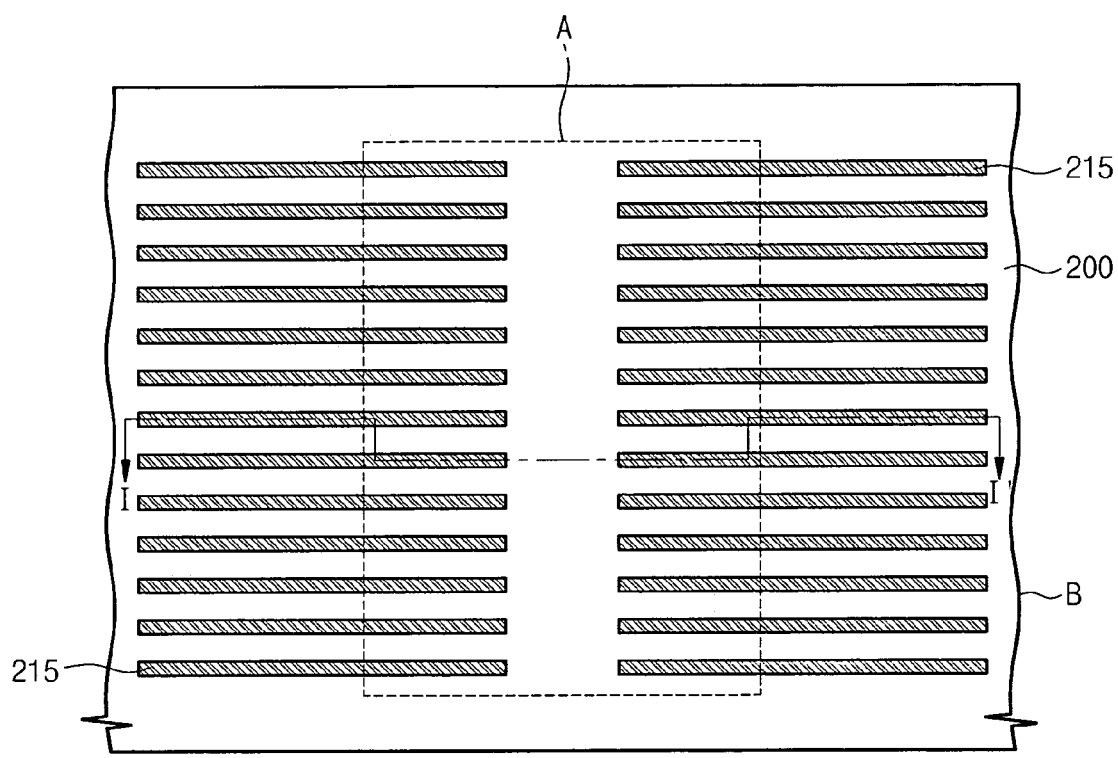

Referring to FIG. 3I, the metal seed layer 202 may be removed except for a region in which the second wiring pattern 214 and the first wiring pattern 208 are formed. Then, a bonding metal layer 215 may be formed on the first wiring pattern 208 and the second wiring pattern 214. The bonding metal layer 215 may be formed by an electroless plating method. The bonding metal layer 215 may include a material that may form a metal bonding layer with materials of bonding pads of a semiconductor device. The bonding metal layer 215 may include tin (Sn) or gold (Ag). Thus, the bonding metal layer 215 formed on the upper surface of the first wiring pattern 208 and the side surfaces of the second wiring pattern 214 adjacent to the mounting region A of the wiring substrate may be bonded with the bonding pads of the semiconductor device.

Figure 4A:
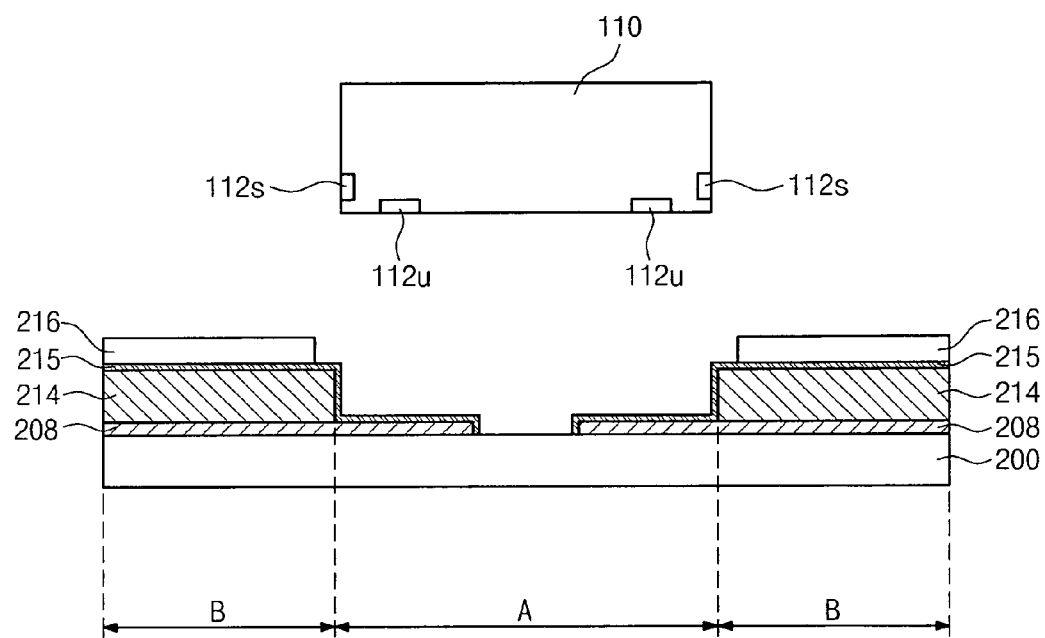

Although not shown, an insulating layer 216 of FIG. 4A may be further formed in a non-mounting region B on a resulting structure including the bonding metal layer 215. The insulating layer may include solder resist. The insulating layer may be in the non-mounting region B of the wiring substrate and may protect the wiring substrate including the first wiring pattern 208 and the second wiring pattern 214 from an external environment.

A wiring substrate fabricated in the above-mentioned manner may include a wiring pattern having a stepped surface configured to electrically connect to side bonding pads of a semiconductor device. Thus, the wiring substrate allowing a semiconductor device including the side bonding pads to be mounted thereon may be provided. Also, the wiring substrate may provide an electrical connection with the bonding pads of the semiconductor device by using a bonding metal layer that may be provided on an upper surface and the stepped surface of the wiring pattern. Thus, bumps are not needed. Accordingly, in the wiring substrate, the pitch, width and/or number of wiring patterns may be increased, unlike a conventional wiring substrate. Therefore, a process margin may be ensured in fabricating a semiconductor device package. Furthermore, because the stepped surfaces of the wiring patterns may correspond to the mounting region of the wiring substrate, self-alignment may be achieved in a process of mounting the semiconductor device on the wiring substrate.

Figure 4B:
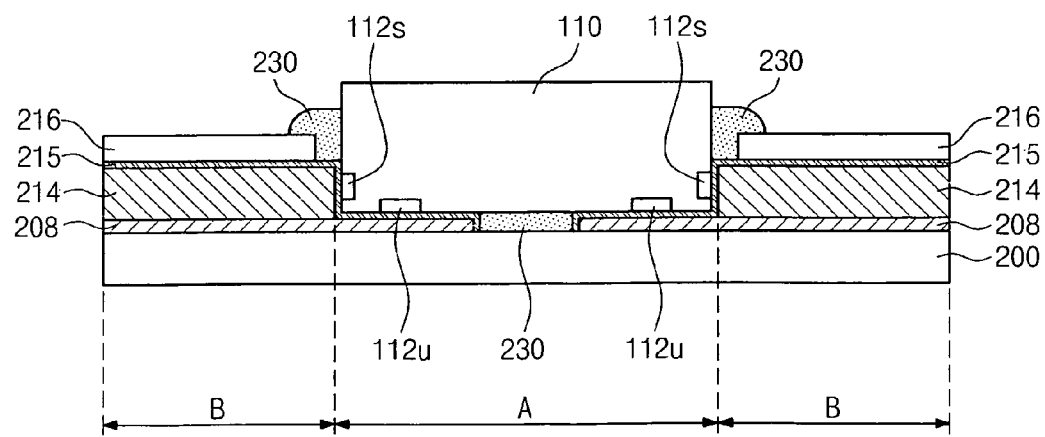

FIGS. 4A and 4B are cross-sectional views for explaining a method of fabricating a semiconductor device package according to example embodiments, which are taken along line I-I' of FIG. 3I. Referring to FIG. 4A, a wiring substrate fabricated by the method described with reference to FIGS. 3A through 3I may be prepared. A semiconductor device including an active surface, a rear surface facing the active surface and a side surfaces may be prepared.

The semiconductor device 110 may include the active surface, the rear surface facing the active surface, and the side surfaces. The semiconductor device 110 may be mounted such that the active surface contacts the mounting region A of the wiring substrate. Side surfaces of second wiring pattern 214 adjacent to the mounting region A of the wiring substrate may correspond to the mounting region A of the wiring substrate, and thus the side surfaces of the semiconductor device 110 may contact the side surfaces of the second wiring pattern 214.

Bonding pads 112s may be on the side surfaces of the semiconductor device 110. The bonding pads 112s and 112u of the semiconductor device 110, according to example embodiments, may be on the active surface and/or the side surfaces of the semiconductor device 110. The semiconductor device 110, according to example embodiments, may include side bonding pads 112s and/or active-surface bonding pads 112u. The side bonding pads 112s and the active-surface bonding pads 112u may be arranged on the side surfaces and/or the active surface of the semiconductor device 110 so as to be on different planes.

Referring to FIG. 4B, the semiconductor device 110 may be mounted in the mounting region A of the wiring substrate such that the active surface and the side surfaces of the semiconductor device 110 may contact the wiring substrate. The semiconductor device 110 may be mounted in the mounting region A of the wiring substrate by using a thermo-compression bonding method or a thermo-sonic bonding method. A bonding metal layer 215 of the wiring substrate may form a metal bonding layer with the bonding pads 112s and 112u of the semiconductor device 110 by energy received during a mounting process, thereby electrically/physically connecting the wiring substrate and the semiconductor device 110.

The side surfaces of the second wiring pattern 214 adjacent to the mounting region A of the wiring substrate may be substantially perpendicular to an upper surface of a first wiring pattern 208, and thus the side surfaces of the second wiring pattern 214 adjacent to the mounting region A of the wiring substrate may correspond to the mounting region A of the wiring substrate. Thus, self-alignment may be achieved in a process of mounting the semiconductor device 110 on the wiring substrate. An insulating resin 230 may be formed between the wiring substrate and the semiconductor device 100 and the side surfaces of the semiconductor device 110.

A semiconductor device package, fabricated by the method described above, may include a wiring substrate including a wiring pattern with a stepped surface, and the stepped surface may be electrically connected to side bonding pads of a semiconductor device. Thus, the semiconductor device package including the semiconductor device with the side bonding pads may be fabricated. Also, the wiring substrate may provide an electrical connection with the bonding pads of the semiconductor device by using a bonding metal layer on an upper surface and the stepped surface of the wiring pattern. Because bumps are not required, the wiring substrate according to example embodiments, may allow an increase in pitch, width and number of wiring patterns. Therefore, a process margin for fabricating the semiconductor device package may be ensured. Furthermore, because the stepped surfaces of the wiring pattern may correspond to the mounting region of the wiring substrate, self-alignment may be achieved in a process of mounting the semiconductor device on the wiring substrate.

A semiconductor device package according to example embodiments may include a wiring substrate including a stepped surface that may be electrically connected with side bonding pads of a semiconductor device. Accordingly, the semiconductor device, which may include bonding pads on an active surface and/or a side surface thereof, may be mounted on the wiring substrate without using bumps. Thus, a process of fabricating the semiconductor device package may be facilitated, and the semiconductor device package including the semiconductor device including the side bonding pads may be provided.

According to example embodiments, a wiring substrate may allow a semiconductor device including bonding pads on its active surface and/or side surface to be mounted may be fabricated without bumps. Thus, a process of fabricating the semiconductor device package may be facilitated, and the semiconductor device package including the semiconductor device with side bonding pads may be provided.

Also, a semiconductor device package including a wiring substrate that allows a semiconductor device including bonding pads on an active surface and/or a side surface to be mounted thereon without using bumps, and a method of fabricating the same may be provided. Accordingly, a process of fabricating the semiconductor device package may be facilitated, and the semiconductor device package including the semiconductor device including the bonding pads on its side surface may be provided.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of fabricating a wiring substrate, comprising:
   preparing a contiguous base film including a first region and a second region, wherein the first region is contiguous with the second region;
   forming a first wiring pattern on the second region and extending into the first region;
   forming a second wiring pattern on the first wiring pattern on the second region, wherein a side surface of the second wiring pattern adjacent to the first region is configured to electrically connect to a bonding pad on a side surface of a semiconductor device.

2. The method of claim 1, wherein forming the second wiring pattern includes forming the side surface of the second wiring pattern substantially perpendicularly to an upper surface of the first wiring pattern.

3. The method of claim 1, wherein the contiguous base film includes polyimide.

4. The method of claim 1, wherein forming the first wiring pattern comprises:
   forming a metal seed layer on a surface of the contiguous base film;
   forming a first photoresist pattern exposing a first wiring pattern region on the metal seed layer; and
   forming the first wiring pattern on the first wiring pattern region.

5. The method of claim 4, wherein the first wiring pattern includes copper.

6. The method of claim 4, wherein forming the second wiring pattern comprises:
   forming a second photoresist pattern exposing a second wiring pattern region on a resulting structure including the first wiring pattern;
   forming the second wiring pattern on the second wiring pattern region;
   removing the second photoresist pattern and the first photoresist pattern; and
   removing the metal seed layer except for a region in which the second wiring pattern and the first wiring pattern are formed.

7. The method of claim 6, wherein the second wiring pattern includes copper.

8. The method of claim 1, further comprising:
   forming a bonding metal layer on the first wiring pattern and the second wiring pattern.

9. The method of claim 8, wherein forming the bonding metal layer uses an electroless plating method.

10. The method of claim 8, further comprising:
    forming an insulating layer on the second region after forming the bonding metal layer.

11. A method of fabricating a semiconductor device package, comprising:
    fabricating a wiring substrate by the method disclosed in claim 1;
    preparing a semiconductor device including a bonding pad; and
    mounting the semiconductor device on a first region of the wiring substrate,
    wherein the bonding pad of the semiconductor device and a side surface of a second wiring pattern adjacent to the first region of the wiring substrate are electrically connected.

12. The method of claim 11, wherein the semiconductor device includes a first surface, a second surface facing the first surface and a side surface,
    wherein the bonding pad is on the side surface.

13. The method of claim 12, wherein the semiconductor device further includes a bonding pad on the first surface.

14. The method of claim 11, wherein mounting the semiconductor device includes a thermo-compression bonding method or a thermo-sonic bonding method.

15. The method of claim 11, further comprising:
    forming an insulating resin between the wiring substrate and the semiconductor device and on the side surface of the semiconductor device.

16. A wiring substrate, comprising:
    a base film including a first region and a second region;
    a first wiring pattern on the second region and extending into the first region; and
    a second wiring pattern on the first wiring pattern on the second region, wherein a side surface of the second wiring pattern adjacent to the first region is configured to electrically connect to a semiconductor device.

17. The wiring substrate of claim 16, further comprising:
    an insulating layer on the second region.

18. The wiring substrate of claim 16, wherein the side surface of the second wiring pattern is substantially perpendicular to an upper surface of the first wiring pattern.

19. The wiring substrate of claim 16, wherein the base film includes polyimide.

20. The wiring substrate of claim 16, wherein the first wiring pattern and the second wiring pattern include copper.

21. The wiring substrate of claim 16, further comprising:
    a metal seed layer between the first wiring pattern and the base film.

22. The wiring substrate of claim 16, further comprising:
    a bonding metal layer on the first wiring pattern and the second wiring pattern.

23. A semiconductor device package comprising:
    the wiring substrate of claim 16; and
    a semiconductor device on a first region of the wiring substrate, wherein the semiconductor device includes bonding pads and at least one of side surfaces of the second wiring patterns adjacent to the first region of the wiring substrate is electrically connected to at least one of the bonding pads of the semiconductor device.

24. The semiconductor device package of claim 23, wherein the semiconductor device includes a first surface, a second surface facing the first surface and a side surface,
    wherein the bonding pads are on the side surface.

25. The semiconductor device package of claim 24, wherein the semiconductor device further includes bonding pads on the first surface.

26. The semiconductor device package of claim 23, further comprising:
    an insulating resin between the wiring substrate and the semiconductor device and on the side surface of the semiconductor device.

* * * * *